(12) United States Patent
Jung et al.

(10) Patent No.: US 12,250,859 B2
(45) Date of Patent: Mar. 11, 2025

(54) DISPLAY DEVICE

(71) Applicant: SAMSUNG DISPLAY CO., LTD., Yongin-si (KR)

(72) Inventors: Joohye Jung, Seoul (KR); Wonjang Ki, Seoul (KR); Keonwoo Kim, Cheonan-si (KR); Dong-Hyun Lee, Suwon-si (KR); Mijin Jun, Cheonan-si (KR); Sangmi Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/498,017

(22) Filed: Oct. 30, 2023

(65) Prior Publication Data

US 2024/0065062 A1 Feb. 22, 2024

Related U.S. Application Data

(63) Continuation of application No. 17/202,822, filed on Mar. 16, 2021, now Pat. No. 11,805,684.

(30) Foreign Application Priority Data

Mar. 19, 2020 (KR) .................. 10-2020-0034041

(51) Int. Cl.
*H10K 59/131* (2023.01)
*G06F 3/044* (2006.01)
(Continued)

(52) U.S. Cl.
CPC ......... *H10K 59/131* (2023.02); *G06F 3/0443* (2019.05); *H10K 59/40* (2023.02); *H10K 50/844* (2023.02)

(58) Field of Classification Search
CPC .... G06F 3/0443; G06F 3/0445; G06F 3/0446; G06F 3/044; H10K 59/131; H10K 59/40; H10K 50/844
See application file for complete search history.

(56) References Cited

U.S. PATENT DOCUMENTS

| 10,347,866 B1 | 7/2019 | Kim |
| 10,770,681 B2 | 9/2020 | Lee et al. |
(Continued)

FOREIGN PATENT DOCUMENTS

| EP | 3460622 A2 | 3/2019 |
| EP | 3522229 A1 | 8/2019 |
(Continued)

*Primary Examiner* — Sardis F Azongha
(74) *Attorney, Agent, or Firm* — Womble Bond Dickinson (US) LLP

(57) ABSTRACT

A display device includes: a base layer having a first area and a second area adjacent to the first area; a plurality of pixels on the first area of the base layer; a power line configured to supply the plurality of pixels with power; a power pattern on the second area and electrically connected to the power line; and a protrusion on the second area, the protrusion surrounding at least a portion of the first area and including a first protruding portion and a second protruding portion on the first protruding portion, wherein the power pattern includes an overlapping portion between the first protruding portion and the second protruding portion, the overlapping portion having an opening.

19 Claims, 8 Drawing Sheets

(51) Int. Cl.
  *H10K 50/844* (2023.01)
  *H10K 59/40* (2023.01)

(56) References Cited

U.S. PATENT DOCUMENTS

| | | |
|---|---|---|
| 10,777,771 B2 | 9/2020 | Lee et al. |
| 10,978,447 B2 | 4/2021 | Kim et al. |
| 11,018,203 B2 | 5/2021 | Song |
| 11,018,212 B2 | 5/2021 | Cho et al. |
| 11,294,489 B2 * | 4/2022 | Lee ................... H10K 59/873 |
| 2015/0382446 A1 | 12/2015 | Kwon et al. |
| 2017/0288008 A1 | 10/2017 | Kim et al. |
| 2019/0214446 A1 | 7/2019 | Kim |

FOREIGN PATENT DOCUMENTS

| | | |
|---|---|---|
| EP | 3591707 A1 | 1/2020 |
| EP | 3624197 A1 | 3/2020 |
| KR | 10-1856220 B1 | 5/2018 |
| KR | 10-2018-0112171 A | 10/2018 |
| KR | 10-2019-0084192 A | 7/2019 |
| KR | 10-2019-0093228 A | 8/2019 |
| KR | 10-2019-0128030 A | 11/2019 |
| KR | 10-2020-0004935 A | 1/2020 |

* cited by examiner

DISPLAY DEVICE

CROSS-REFERENCE TO RELATED APPLICATIONS

This application is a continuation of U.S. patent application Ser. No. 17/202,822, filed Mar. 16, 2021, which claims priority to and the benefit of Korean Patent Application No. 10-2020-0034041, filed Mar. 19, 2020, the entire content of both of which is incorporated herein by reference.

BACKGROUND

Aspects of some example embodiments of the present invention relate to a display device with increased product reliability.

A display device may be an apparatus having various electronic components such as a display panel that displays an image, an input sensor that detects an external input, and electronic modules. The electronic components may be electrically connected to each other through signal lines. The electronic module may include one or more sensors, such as cameras, infrared sensors, proximity sensors, or the like. The input sensor may be directly formed on the display panel. When the display panel is changed in shape, the input sensor may also be changed in shape.

The above information disclosed in this Background section is only for enhancement of understanding of the background and therefore the information discussed in this Background section does not necessarily constitute prior art.

SUMMARY

Aspects of some example embodiments of the present invention include a display device with relatively increased product reliability.

According to some example embodiments of the present invention, a display device may comprise: a base layer that has a first area and a second area adjacent to the first area; a plurality of pixels on the first area of the base layer; a power line that supplies the plurality of pixels with power; a power pattern on the second area and electrically connected to the power line; and a protrusion on the second area, the protrusion surrounding at least a portion of the first area and including a first protruding portion and a second protruding portion on the first protruding portion. The power pattern may include an overlapping portion between the first protruding portion and the second protruding portion. The overlapping portion may have an opening.

According to some example embodiments, the display device may further comprise: an encapsulation layer on the plurality of pixels; a plurality of sensing electrodes on the first area and directly on the encapsulation layer; and a plurality of sensing lines on the second area and electrically connected to the plurality of sensing electrodes. When viewed in plan, the plurality of sensing lines may be spaced apart from the opening.

According to some example embodiments, a portion of each of the plurality of sensing lines may overlap the power pattern.

According to some example embodiments, the power pattern may includes: a first pattern portion that extends along a first direction; and a plurality of second pattern portions that protrude along a second direction from the first pattern portion, the second direction intersecting the first direction. The plurality of second pattern portions may include: a first branch pattern portion that overlaps at least portions of the plurality of sensing lines; and a second branch pattern portion that does not overlap the plurality of sensing lines.

According to some example embodiments, the opening may be defined in each of the first branch pattern portion and the second branch pattern portion.

According to some example embodiments, the opening may be defined in the first branch pattern portion and may not be defined in the second branch pattern portion.

According to some example embodiments, the overlapping portion may include a portion of each of the plurality of second pattern portions.

According to some example embodiments, each of the plurality of second pattern portions may have a width of equal to or less than about 1,300 µm in the first direction.

According to some example embodiments, when viewed in plan, a minimum distance between the opening and the plurality of sensing lines may be equal to or greater than about 58.4 µm.

According to some example embodiments, the plurality of sensing lines may be on the protrusion. Each of the plurality of sensing lines may extend in a direction that intersects an extending direction of the protrusion.

According to some example embodiments, each of the plurality of sensing lines that overlap the protrusion may have a crooked shape.

According to some example embodiments, the display device may further comprise an additional protrusion on the second area and closer than the protrusion to the first area. A portion of the power pattern may be on the additional protrusion.

According to some example embodiments, the additional protrusion and the second protruding portion may include the same material.

According to some example embodiments, the opening may be provided in plural. A pitch between the plurality of openings may be about 40 µm. Each of the plurality of openings may have a tetragonal shape.

According to some example embodiments, the first protruding portion may include an organic material.

According to some example embodiments of the present invention, a display device may comprise: a display panel that has an active area and a peripheral area; and an input sensor directly on the display panel. The display panel may include: a plurality of pixels on the active area; a protrusion on the peripheral area, the protrusion surrounding at least a portion of the active area and including a first protruding portion and a second protruding portion on the first protruding portion; a power line that supplies the plurality of pixels with power; and a power pattern on the peripheral area and electrically connected to the power line, the power pattern including an overlapping portion between the first protruding portion and the second protruding portion, the overlapping portion having an opening. The input sensor may include: a plurality of sensing electrodes on the active area; and a plurality of sensing lines on the peripheral area and electrically connected to the plurality of sensing electrodes, wherein each of the plurality of sensing lines that overlap the protrusion has a crooked shape corresponding to a shape of the protrusion.

According to some example embodiments, the plurality of sensing lines may be on the overlapping portion. When viewed in plan, the plurality of sensing lines may be spaced apart from the opening.

According to some example embodiments, the protrusion may extend along a first direction. The power pattern may include a first branch pattern portion and a second branch pattern portion that extend along a second direction intersecting the first direction and that are between the first protruding portion and the second protruding portion. The opening may be provided in at least one selected from the first branch pattern portion and the second branch pattern portion.

According to some example embodiments, at least portions of the plurality of sensing lines may be on the first branch pattern portion. The opening may be defined in the first branch pattern portion.

According to some example embodiments of the present invention, a display device may comprise: a plurality of pixels on an active area; a protrusion that surrounds at least a portion of the active area and includes a first protruding portion and a second protruding portion on the first protruding portion; a power pattern that transmits power to the plurality of pixels and is between the first protruding portion and the second protruding portion; an encapsulation layer on the plurality of pixels; a plurality of sensing electrodes on the active area; and a plurality of sensing lines electrically connected to the plurality of sensing electrodes and spaced apart from the power pattern across the second protruding portion. The power pattern may have an opening that exposes a portion of the first protruding portion. Each of the plurality of sensing lines that overlap the protrusion may have a crooked shape corresponding to a shape of the protrusion.

DETAILED DESCRIPTION

Figure 1:
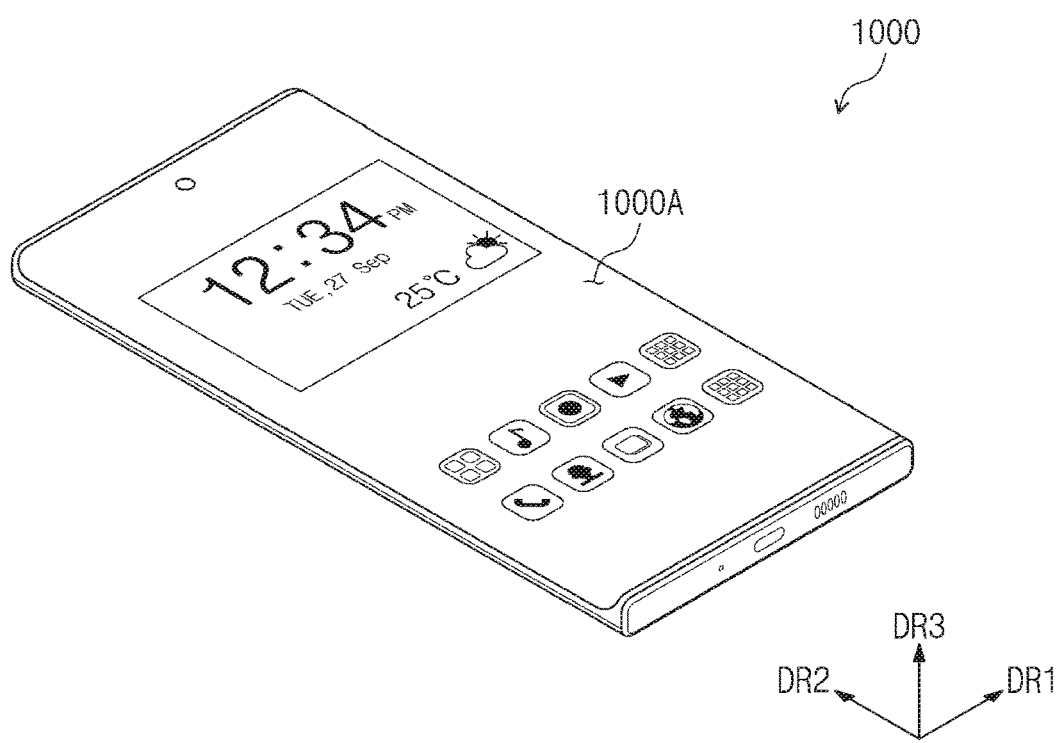
FIG. 1 illustrates a perspective view showing a display device according to some example embodiments of the present invention.

In this description, when a certain component (or region, layer, portion, etc.) is referred to as being "on", "connected to", or "coupled to" other component(s), the certain component may be directly on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe aspects of some example embodiments of the present invention in conjunction with the accompanying drawings.

FIG. 1 illustrates a perspective view showing a display device according to some example embodiments of the present invention.

Referring to FIG. 1, a display device 1000 may be an apparatus that is activated in response to an electrical signal. For example, the display device 1000 may be a mobile phone, a tablet computer, an automotive navigation system, a game console, or a wearable apparatus, but embodiments according to the present invention are not necessarily limited thereto. FIG. 1 shows a mobile phone as an example of the display device 1000.

The display device 1000 may display an image through an active area 1000A. The active area 1000A may include a plane defined by a first direction DR1 and a second direction DR2. The active area 1000A may further include curved surfaces bent from at least two sides of the plane. The shape of the active area 1000A, however, is not necessarily limited thereto. For example, the active area 1000A may include only the plane, and may further include a plurality of curved surfaces bent from at least two sides of the plane, for example, four curved surfaces bent from four sides of the plane.

A thickness direction of the display device 1000 may be parallel to a third direction DR3 that intersects the first and second directions DR1 and DR2. Therefore, the third direction DR3 may be used to distinguish front and rear surfaces (or top and bottom surfaces) of each of members that constitute the display device 1000. In this description, the phrase "when viewed in plan" may be interpreted as "when viewed in the thickness direction of the display device 1000" or "when viewed in the third direction DR3."

Figure 2:
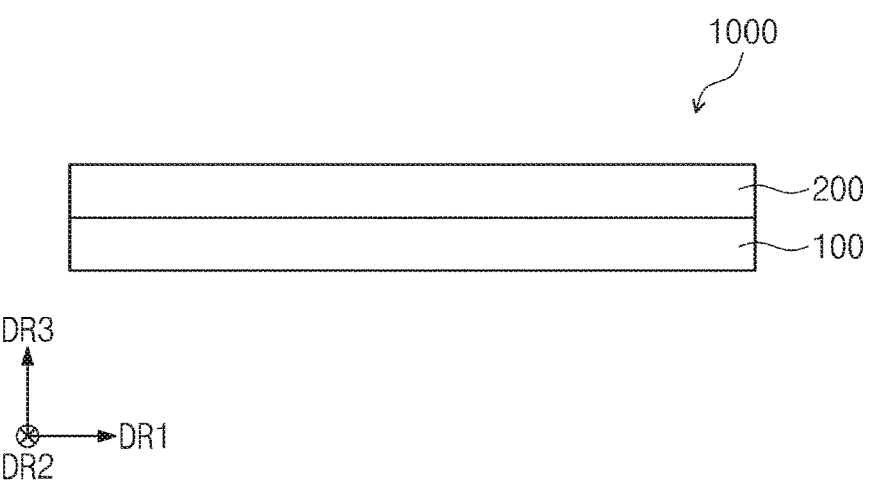
FIG. 2 illustrates a simplified cross-sectional view showing a display device according to some example embodiments of the present invention.

FIG. 2 illustrates a simplified cross-sectional view showing some components of a display device according to some example embodiments of the present invention.

Referring to FIG. 2, the display device 1000 may include a display panel 100 and an input sensor 200.

The display panel 100 may be a component that substantially generates an image. The display panel 100 may be an emissive display panel. For example, the display panel 100 may be an organic light emitting display panel, a quantum-dot light emitting display panel, or a micro-LED display panel. Alternatively, the display panel 100 may be a light-receiving type display panel. For example, the display panel 100 may be a liquid crystal display panel.

The input sensor 200 may be located on the display panel 100. The input sensor 200 may detect an external input externally applied. The external input may be a user's input. The user's input may include a user's body part, light, heat, pen, pressure, or any other types of external input.

The input sensor 200 may be formed on the display panel 100 in a successive process. In this case, it may be expressed that the input sensor 200 is directly located on the display panel 100. The phrase "directly located on" may mean that no component is located between the input sensor 200 and the display panel 100.

For example, no adhesive member may be separately located between the input sensor 200 and the display panel 100.

According to some example embodiments, the display device 1000 may further include a window located on the input sensor 200. The window may include an optically transparent material, for example, glass or plastic. The window may have a single-layered or multi-layered structure.

Figure 3:
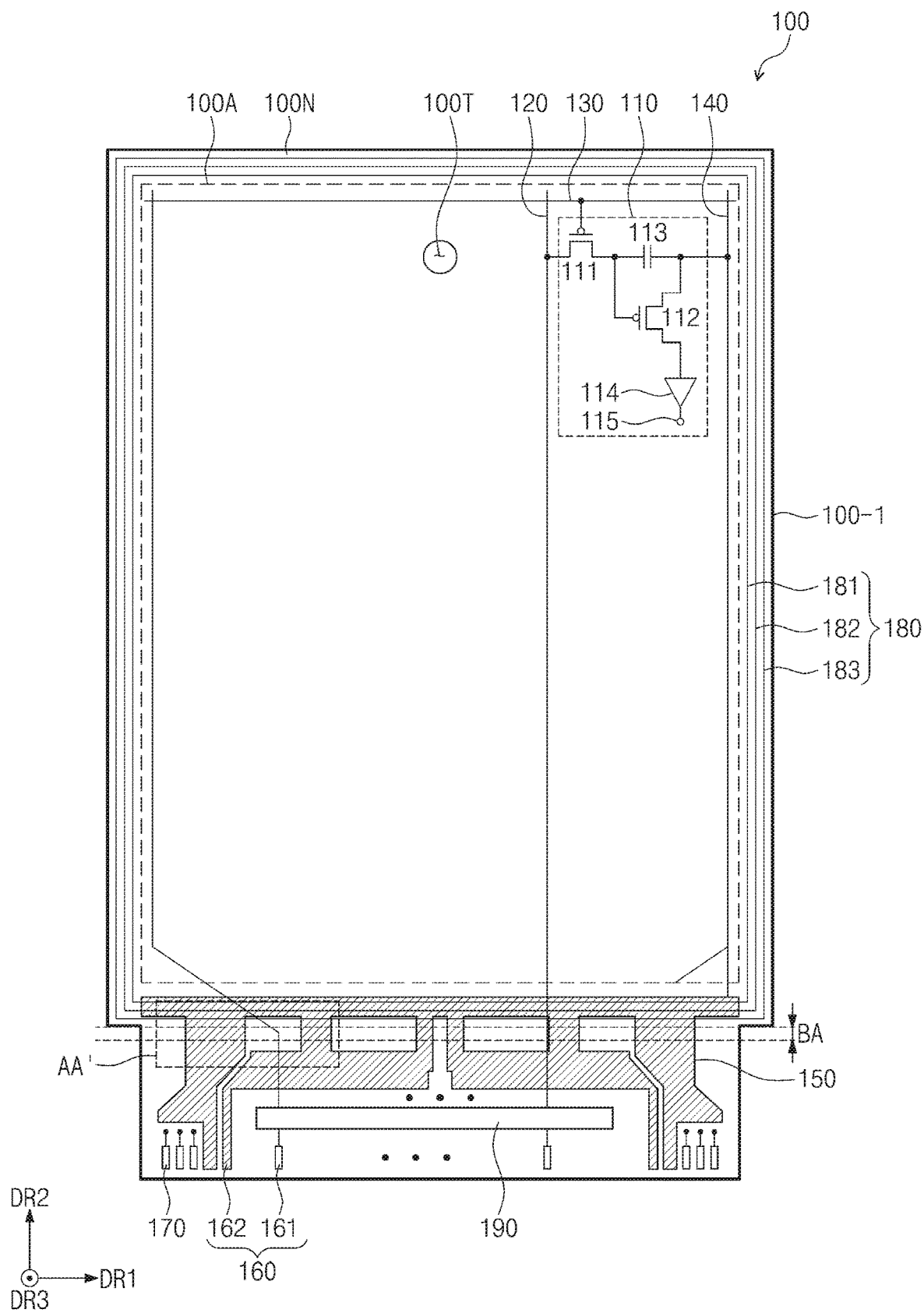
FIG. 3 illustrates a plan view showing a display panel according to some example embodiments of the present invention.

FIG. 3 illustrates a plan view showing a display panel according to some example embodiments of the present invention.

Referring to FIG. 3, an active area 100A and a peripheral area 100N may be defined on the display panel 100. The active area 100A may be a region activated with an electrical signal. For example, the active area 100A may be a region that displays an image. The peripheral area 100N may be adjacent to and surround the active area 100A. The peripheral area 100N may include a driver line or a driver circuit for driving the active area 100A.

FIG. 3 shows the display panel 100 prior to being assembled. During an assembly procedure, a bending area BA defined on the peripheral area 100N may be bent to have a certain curvature. Therefore, components on and under the bending area BA may be arranged to face each other.

A through hole 100T may be defined on the active area 100A of the display panel 100. The active area 100A may surround the through hole 100T. The present invention, however, is not necessarily limited thereto. For example, a portion of the through hole 100T may be in contact with the active area 100A, and another portion of the through hole 100T may be in contact with the peripheral area 100N.

The through hole 100T may be a space through which is transmitted a signal that is input to or output from an electronic module. For example, the electronic module is a camera module.

The through hole 100T may be defined by removing all or at least a portion of components that constitute the display panel 100. When viewed in plan, the through hole 100T may have a circular shape, an oval shape, or a polygonal shape including at least one curved side, but embodiments according to the present invention are not limited to a particular embodiment. For example, according to some example embodiments of the present invention, the through hole 100T may be omitted.

The display panel 100 may include a base layer 100-1, a plurality of pixels 110, a plurality of signal lines 120, 130, and 140, a power pattern 150, a plurality of display pads 160, a plurality of sensing pads 170, and a plurality of protrusions 180.

The base layer 100-1 may include a glass substrate, an organic/inorganic composite substrate, or a synthetic resin film. The synthetic resin film may include a thermosetting resin. The base layer 100-1 may have a multi-layered structure. For example, the base layer 100-1 may have a tri-layered structure including a synthetic resin layer, an adhesive layer, and a synthetic resin layer. For example, the synthetic resin layer may be a polyimide resin layer, but the material of the synthetic resin layer is not particularly limited. The synthetic resin layer may include at least one selected from acryl-based resin, methacryl-based resin, polyisoprene, vinyl-based resin, epoxy-based resin, urethane-based resin, cellulose-based resin, siloxane-based resin, polyamide-based resin, and perylene-based resin.

The base layer 100-1 may have a partial area, which is called a first area, included in the active area 100A, and may also have another partial area, which is called a second area, included in the peripheral area 100N.

The signal lines 120, 130, and 140 may be connected to the pixels 110, and may transmit electrical signals to the pixels 110. FIG. 3 shows, as an example, that the signal lines 120, 130, and 140 may include a data line 120, a scan line 130, and a power line 140. This, however, is illustrated as an example, and according to some example embodiments, for example, the signal lines 120, 130, and 140 may further include at least one selected from an initialization power line and an emission control line, but embodiments according to the present invention are not necessarily limited thereto.

The pixels 110 may be located on the active area 100A. FIG. 3 illustrates an example enlarged circuit diagram of one of the plurality of pixels 110. Embodiments according to the present disclosure, however, are not limited to the pixel circuit of the pixels 110 illustrated in FIG. 3. For example, according to some example embodiments, the pixel circuit of the pixels 110 may include additional components or fewer components without departing from the spirit and scope of embodiments according to the present disclosure.

The pixel 110 may include a first transistor 111, a second transistor 112, a capacitor 113, and a light emitting element 114. This, however, is merely an example, and according to some example embodiments, the pixel 110 may include electronic elements having various configurations and arrangements, but embodiments according to the present invention are not necessarily limited thereto. For example, the pixel 110 may include an equivalent circuit including seven transistors and one capacitor, and the equivalent circuit of the pixel 110 may be variously changed in shape.

The first transistor 111 may be a switching element that controls on-off of the pixel 110. In response to a scan signal transmitted through the scan line 130, the first transistor 111 may transfer or block a data signal transmitted through the data line 120.

The capacitor 113 may be connected to the first transistor 111 and the power line 140. The capacitor 113 may charge an amount of charges that corresponds to a difference between a data signal transmitted from the first transistor 111 and a first power signal applied to the power line 140.

The second transistor 112 may be connected to the first transistor 111, the capacitor 113, and the light emitting element 114. In response to an amount of charges accumulated in the capacitor 113, the second transistor 112 may control a driving current that flows through the light emitting element 114. A turn-on time of the second transistor 112 may be determined based on an amount of charges accumulated in the capacitor 113. During its turn-on time, the second transistor 112 may provide the light emitting element 114 with the first power signal transmitted through the power line 140.

In accordance with an electrical signal, the light emitting element 114 may generate light or control an amount of light. For example, the light emitting element 114 may include an organic light emitting element, a quantum-dot light emitting element, a micro-LED element, or a nano-LED element.

The light emitting element 114 may be connected to a power terminal 115, and may be provided with a power signal (referred to hereinafter as a second power signal or a ground voltage) different from the first power signal provided from the power line 140. The light emitting element 114 may receive a driving current that corresponds to a difference between the second power signal and an electrical signal that is provided from the second transistor 112, and then may generate light that corresponds to the driving current.

The power pattern 150 may be located on the peripheral area 100N. The power pattern 150 may be electrically connected to the power line 140. Although FIG. 3 shows a single power line 140, the power line 140 may be provided in plural, and the plurality of power lines 140 may all be electrically connected to the power pattern 150.

The plurality of protrusions 180 may be located on the peripheral area 100N, and may surround at least a portion of the active area 100A. For example, each of the plurality of protrusions 180 may surround an entirety of the active area 100A or at least a portion of the active area 100A. Each of the plurality of protrusions 180 may have a closed curved shape or a partially opened shape.

The plurality of protrusions 180 may include a first protrusion 181, a second protrusion 182, and a third protrusion 183. The number of the plurality of protrusions 180, however, is not limited thereto, but may either be two or be four or more.

Among the plurality of protrusions 180, the first protrusion 181 may be located closest to the active area 100A. The first protrusion 181, the second protrusion 182, and the third protrusion 183 may be sequentially arranged in a direction departing from the active area 100A. The second protrusion 182 may surround at least a portion of the first protrusion 181. The third protrusion 183 may surround at least a portion of the second protrusion 182.

The display pads 160 may include a first pad 161 and a second pad 162. The first pad 161 may be provided in plural, and the plurality of first pads 161 may be connected to corresponding data lines 120. The second pad 162 may be electrically connected through the power pattern 150 to the power line 140. The first pad 161 may be a portion of the power pattern 150.

The display panel 100 may provide the pixels 110 with electrical signals that are externally provided through the display pads 160. The display pads 160 may further include pads for receiving different electrical signals, in addition to the first pad 161 and the second pad 162, but embodiments according to the present invention are not limited to a particular embodiment.

The plurality of sensing pads 170 may be electrically connected to sensing electrodes (see 210, 220 of FIG. 4) of a sensor (see 200 of FIG. 4) which will be discussed below. Among the plurality of sensing pads 170, some sensing pads may be arranged such that the sensing pads are spaced apart from other sensing pads across the display pads 160. Embodiments according to the present invention, however, are not necessarily limited thereto, and an arrangement relationship between the sensing pads 170 and the display pads 160 may be variously changed.

A driver chip 190 may be mounted on the peripheral area 100N of the display panel 100. The driver chip 190 may be a timing control circuit in the form of a chip. In this case, the data lines 120 may be electrically connected through the driver chip 190 to the first pads 161. This, however, is merely an example, and the driver chip 190 may be mounted on a film separated from the display panel 100. In this case, the driver chip 190 may be electrically connected through the film to the display pads 160.

Figure 4:
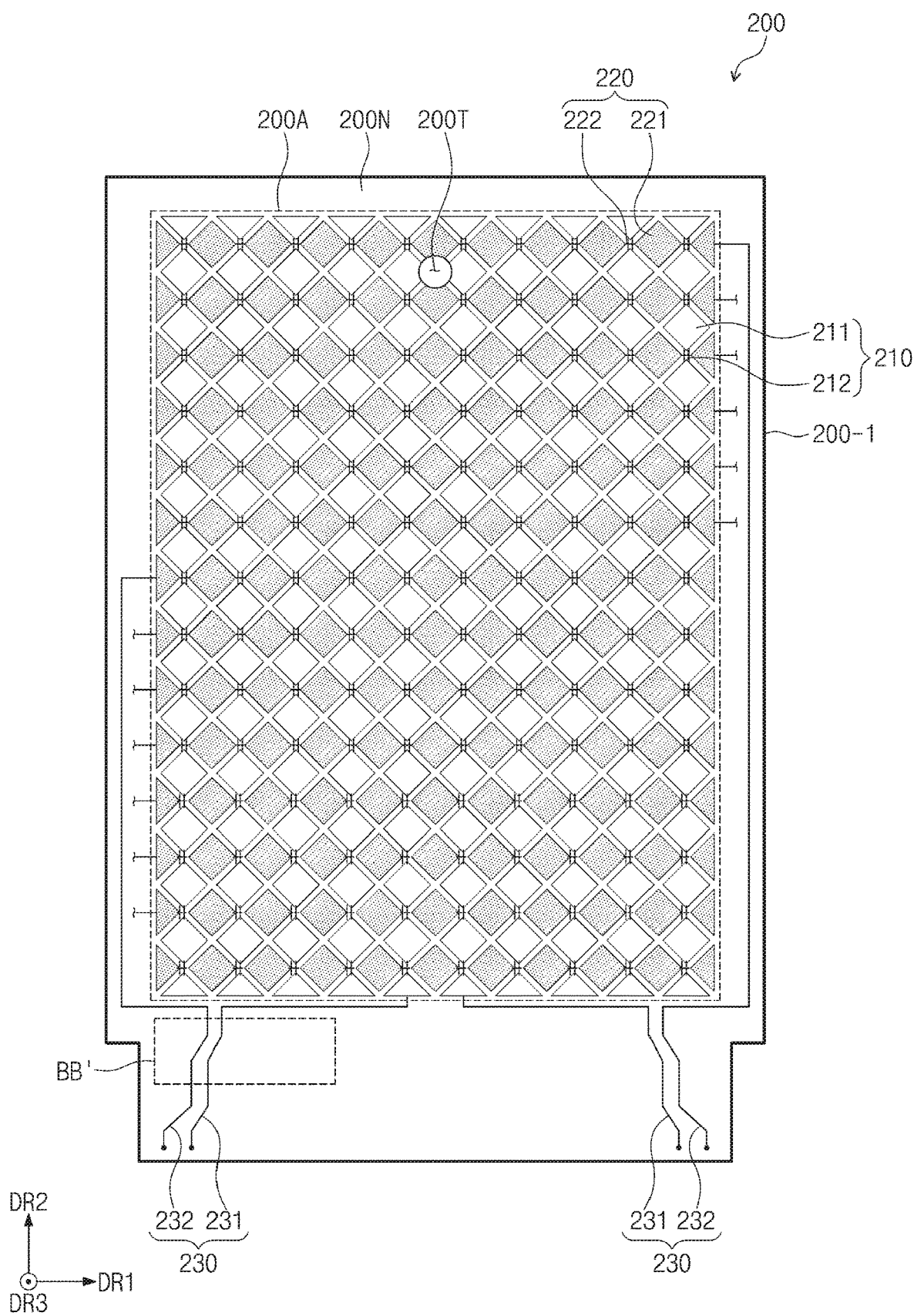
FIG. 4 illustrates a plan view showing an input sensor according to some example embodiments of the present invention.

FIG. 4 illustrates a plan view showing an input sensor according to some example embodiments of the present invention.

Referring to FIG. 4, an active area 200A and a peripheral area 200N may be defined on the input sensor 200. The active area 200A may be a region activated with an electrical signal. For example, the active area 200A may be a region that detects an input. The peripheral area 200N may be adjacent to and surround the active area 200A.

A through hole 200T may be defined on the active area 200A of the input sensor 200. When viewed in plan, the through hole 200T may overlap the through hole (see 100T of FIG. 3) of the display panel (see 100 of FIG. 3) discussed above. The through hole 200T may be defined by removing all of components that constitute the input sensor 200. In some example embodiments of the present invention, the through hole 200T may be omitted.

The input sensor 200 may include a base dielectric layer 200-1, first sensing electrodes 210, second sensing electrodes 220, and sensing lines 230. The first sensing electrodes 210 and the second sensing electrodes 220 may be located on the active area 200A, and the sensing lines 230 may be located on the peripheral area 200N. The input sensor 200 may use a variation in mutual capacitance between the first sensing electrodes 210 and the second sensing electrodes 220, thereby obtaining information about an external input.

The first sensing electrodes 210 may be arranged along the first direction DR1 and may each extend along the second direction DR2. The first sensing electrodes 210 may include first sensing patterns 211 and first connection patterns 212. The first connection patterns 212 may electrically connect two neighboring first sensing patterns 211 to each other. The two neighboring first sensing patterns 211 may be connected to each other through two first connection patterns 212, but embodiments according to the present invention are not necessarily limited thereto.

The second sensing electrodes 220 may be arranged along the second direction DR2 and may each extend along the first direction DR1. The second sensing electrodes 220 may include second sensing patterns 221 and second connection patterns 222. The second connection patterns 222 may electrically connect two neighboring second sensing patterns 221 to each other. Two first connection patterns 212 may be insulated from and intersect one second connection pattern 222.

FIG. 4 shows example shapes and arrangements of the first sensing electrodes 210 and the second sensing electrodes 220, but embodiments according to the present invention are not limited to those illustrated in FIG. 4.

The sensing lines 230 may be electrically connected to corresponding sensing pads (see 170 of FIG. 3) through contact holes. The sensing lines 230 may include first sensing lines 231 and second sensing lines 232.

The first sensing lines 231 may be electrically connected to corresponding first sensing electrodes 210. The second sensing lines 232 may be electrically connected to corresponding second sensing electrodes 220. One of the second sensing lines 232 may be connected to a left side of one of the second sensing electrodes 220, and another of the second sensing lines 232 may be connected to a right side of another of the second sensing electrodes 220. A connection relationship between the first sensing lines 231 and the first sensing electrodes 210 and between the second sensing lines 232 and the second sensing electrodes 220 is not limited to that shown in FIG. 4.

Figure 5A:
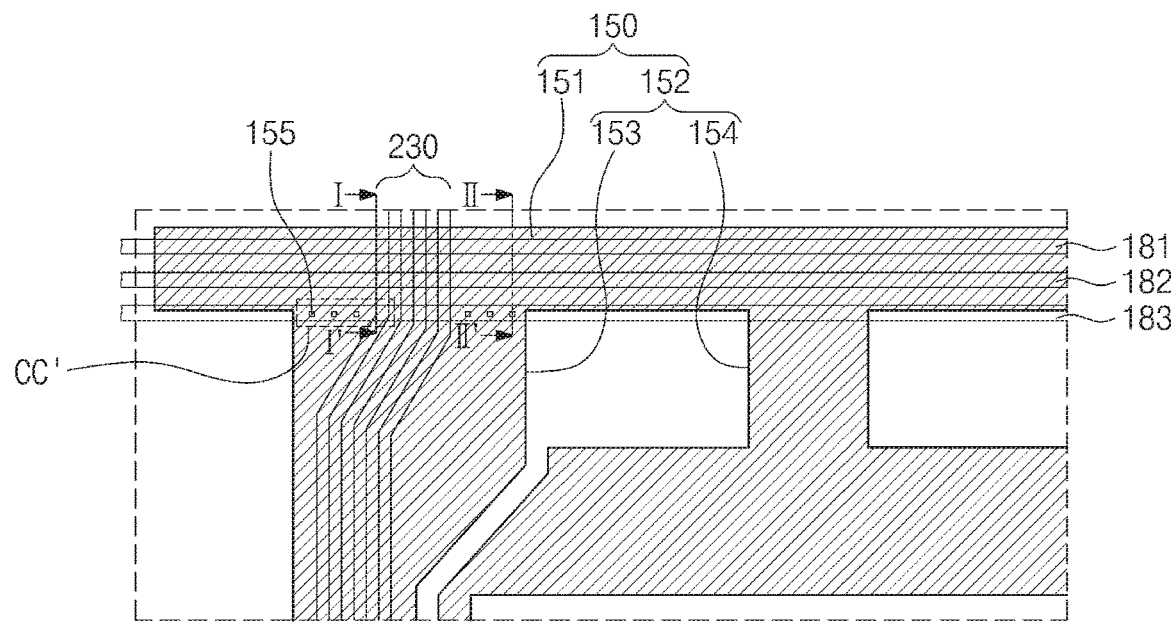
FIG. 5A illustrates an enlarged plan view partially showing a display device according to some example embodiments of the present invention.
Figure 5B:
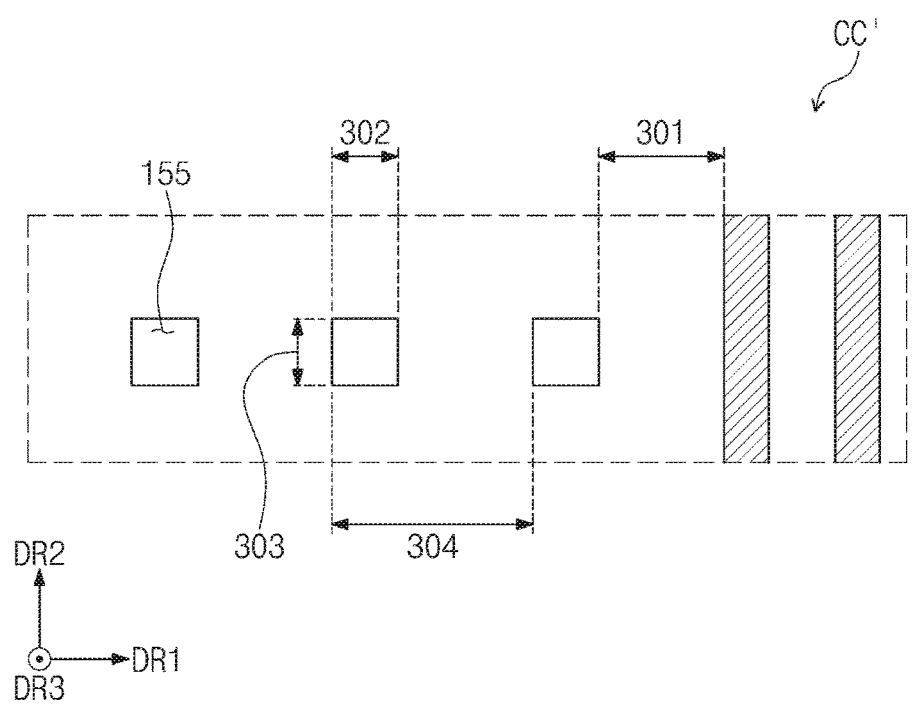
FIG. 5B illustrates an enlarged plan view showing a portion of FIG. 5A.

FIG. 5A illustrates an enlarged plan view partially showing a display device according to some example embodiments of the present invention. FIG. 5B illustrates an enlarged plan view showing a portion of FIG. 5A.

FIG. 5A partially illustrates the display device that corresponds to a region AA' of FIG. 3 or a region BB' of FIG. 4, and FIG. 5B illustrates an enlarged view showing section CC' of FIG. 5A.

Referring to FIGS. 5A and 5B, the power pattern 150 may include a first pattern portion 151 that extends along the first direction DR1 and second pattern portions 152 that protrude along the second direction DR2 from the first pattern portion 151. The second pattern portions 152 may include a first branch pattern portion 153 that overlaps at least portions of the sensing lines 230 and a second branch pattern portion 154 that does not overlap the sensing lines 230.

An opening 155 may be defined in the power pattern 150. The opening 155 may be provided by removing a portion of the power pattern 150. The opening 155 may expose a component located below the power pattern 150. Therefore, the opening 155 may serve as a pathway through which is discharged a gas produced by the component located below the power pattern 150. It may thus be possible to avoid issues caused by the gas, and its description will be given in detail below.

The opening 155 may have a tetragonal shape, for example, a square or rectangular shape when viewed in plan, but embodiments according to the present invention are not necessarily limited thereto. For example, the opening 155 may have a circular shape, an oval shape, or a polygonal shape.

When viewed in plan, the opening 155 may not overlap the sensing lines 230. For example, when viewed in the third direction DR3, the opening 155 may be spaced apart from the sensing lines 230.

The sensing lines 230 may be arranged to overlap the power pattern 150 without overlapping the opening 155. As the power pattern 150 is supplied with constant voltage, the power pattern 150 may shield noise signals that affect the sensing lines 230. Therefore, it may be possible to prevent or reduce sensitivity failure due to noise signals.

A minimum distance 301 between the opening 155 and the sensing lines 230 may range from about 58.4 μm to about 1,300 μm. When the minimum distance 301 is greater than about 1,300 μm, it is unlikely that a gas produced below the power pattern 150 is sufficiently discharged through the opening 155.

The opening 155 may have a width 302 of about 15 μm in the first direction DR1 and a width 303 of about 15 μm in the second direction DR2, and an interval or pitch 304 between adjacent openings 155 may be about 40 μm. The values mentioned above are just an example of design specification, and embodiments according to the present invention are not necessarily limited thereto.

In some example embodiments of the present invention, each of the second pattern portions 152 may have a width of equal to or less than about 1,300 μm. For example, each of the first and second branch pattern portions 153 and 154 may have a maximum width of equal to or less than about 1,300 μm in the first direction DR1. In this case, a gas produced by a component located below the power pattern 150 may be discharged through a space between the second pattern portions 152. Alternatively, a value of equal to or less than about 1,300 μm may be given as a width of the second branch pattern portion 154 where the opening 155 is not defined, and no limitation in width may be imposed on the first branch pattern portion 153.

Figure 6:
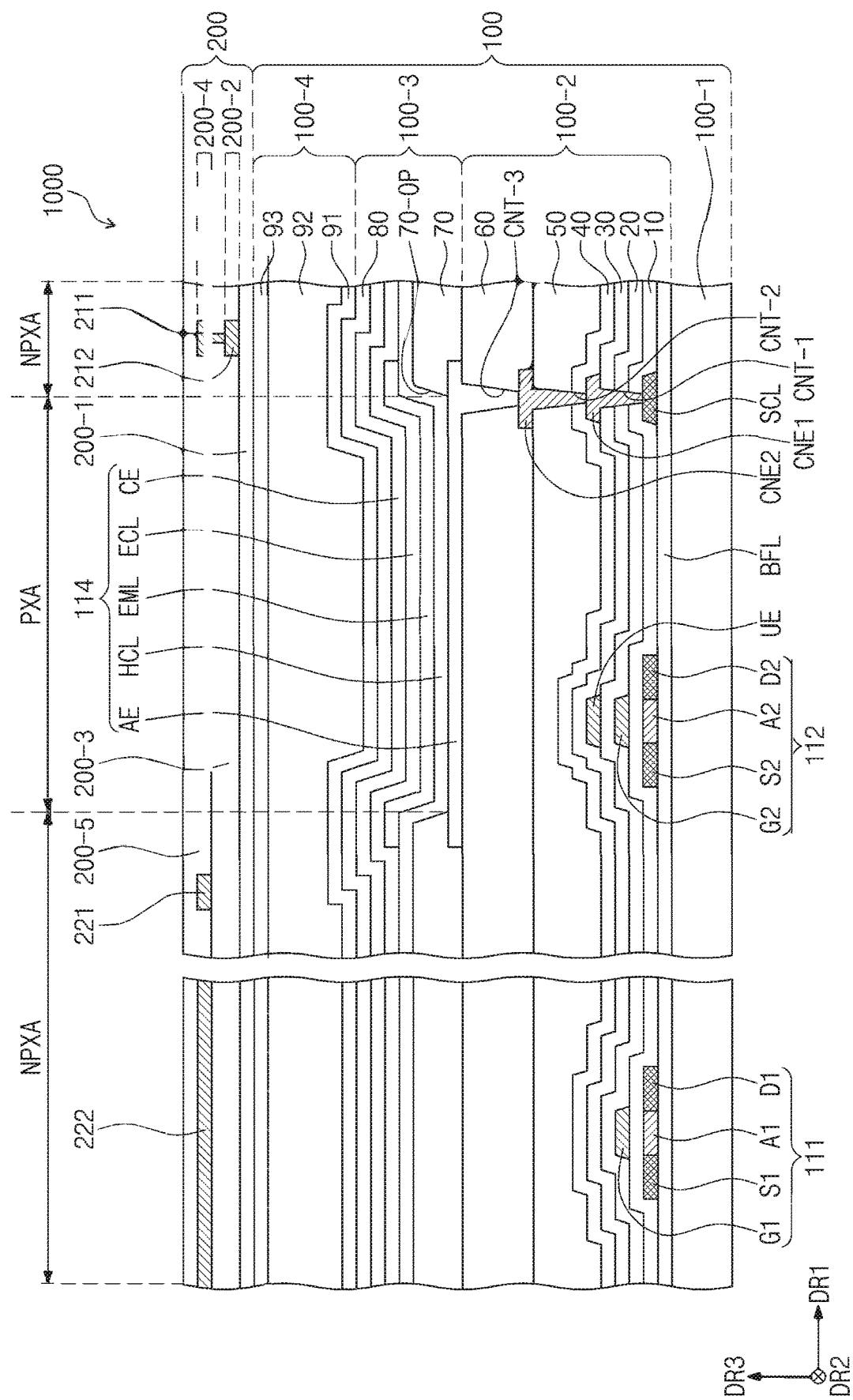
FIG. 6 illustrates a cross-sectional view showing a display device according to some example embodiments of the present invention.

FIG. 6 illustrates a cross-sectional view showing a display device according to some example embodiments of the present invention.

Referring to FIG. 6, the display panel 100 may include a plurality of dielectric layers, a semiconductor pattern, a conductive pattern, and a signal line. A coating or deposition process may be employed to form a dielectric layer, a semiconductor layer, and a conductive layer. Afterwards, a photolithography process may be used to selectively pattern the dielectric layer, the semiconductor layer, and the conductive layer. Through the processes mentioned above, the base layer 100-1 may be provided thereon with the semiconductor pattern, the conductive pattern, and the signal line that are included in a circuit element layer 100-2 and a display element layer 100-3. Thereafter, an encapsulation layer 100-4 may be formed to cover the display element layer 100-3.

The base layer 100-1 may include a synthetic resin film. The synthetic resin film may include a thermosetting resin. The base layer 100-1 may have a multi-layered structure. For example, the base layer 100-1 may have a tri-layered structure including a synthetic resin layer, an adhesive layer, and a synthetic resin layer. For example, the synthetic resin layer may be a polyimide resin layer, but the material of the synthetic resin layer is not particularly limited. The synthetic resin layer may include at least one selected from acryl-based resin, methacryl-based resin, polyisoprene, vinyl-based resin, epoxy-based resin, urethane-based resin, cellulose-based resin, siloxane-based resin, polyamide-based resin, and perylene-based resin. The base layer 100-1 may include a glass substrate or an organic/inorganic composite substrate.

At least one inorganic layer may be formed on a top surface of the base layer 100-1. The inorganic layer may include at least one selected from aluminum oxide, titanium oxide, silicon oxide, silicon oxynitride, zirconium oxide, and hafnium oxide. The inorganic layer may be formed multi-layered. The multi-layered inorganic layers may constitute a barrier layer and/or a buffer layer. In some example embodiments, the display panel 100 is illustrated to include a buffer layer BFL.

The buffer layer BFL increases a bonding force between the base layer 100-1 and the semiconductor pattern. The buffer layer BFL may include a silicon oxide layer and a silicon nitride layer. The silicon oxide layer and the silicon nitride layer may be alternately stacked.

The semiconductor pattern is located on the buffer layer BFL. The semiconductor pattern may include polysilicon. Embodiments according to the present invention, however, are not limited thereto, and the semiconductor pattern may include amorphous silicon or metal oxide.

FIG. 6 merely shows a portion of the semiconductor pattern, and the semiconductor pattern may further be arranged at other regions. The semiconductor pattern may be specifically arranged over the pixels (see 110 of FIG. 3). The semiconductor pattern may have an electrical property that is different based on whether the semiconductor pattern is doped or not. The semiconductor pattern may include a doped region and an undoped region. The doped region may be doped with n-type or p-type impurities. A p-type transistor includes a doped region implanted with p-type impurities.

The doped region has its conductivity greater than that of the undoped region, and substantially serves as an electrode or a signal line. The undoped region substantially corresponds to an active (or channel) of a transistor. For example, a portion of the semiconductor pattern may be an active of a transistor, another portion of the semiconductor pattern may be a source or drain of the transistor, and still another portion of the semiconductor pattern may be a connection electrode or a connection signal line SCL.

As shown in FIG. 6, the first transistor 111 may include a source S1, an active A1, a drain D1 that are formed from the semiconductor pattern, and the second transistor 112 may include a source S2, an active A2, and a drain D2 that are formed from the semiconductor pattern. When viewed in cross-section, the source S1 and the drain D1 extend in opposite directions from the active A1, and likewise, the source S2 and the drain D2 extend in opposite directions from the active A2. FIG. 6 partially shows a connection signal line SCL formed from the semiconductor pattern. According to some example embodiments, when viewed in plan view (e.g., a direction normal or perpendicular with respect to a plane of the display surface of the display device), the connection signal line SCL may be connected to the drain D2 of the second transistor 112.

A first dielectric layer 10 is located on the buffer layer BFL. The first dielectric layer 10 may commonly overlap a plurality of pixels (see 110 of FIG. 3) and may cover the semiconductor pattern. The first dielectric layer 10 may be an inorganic layer and/or an organic layer, and may have a single-layered or multi-layered structure. The first dielectric layer 10 may include at least one selected from aluminum oxide, titanium oxide, silicon oxide, silicon oxynitride, zirconium oxide, and hafnium oxide. In some example embodiments, the first dielectric layer 10 may be a single-layered silicon oxide layer. Likewise the first dielectric layer 10, a dielectric layer of the circuit element layer 100-2 may be an inorganic layer and/or an organic layer, and may have a single-layered or multi-layered structure. The inorganic layer may include at least one selected from the materials mentioned above.

Gates G1 and G2 are located on the first dielectric layer 10. The gates G1 and G2 may each be a portion of a metal pattern. The gates G1 and G2 correspondingly overlap the actives A1 and A2. The gates G1 and G2 may serve as a mask in a process where the semiconductor pattern is doped.

A second dielectric layer 20 may be located on the first dielectric layer 10 and may cover the gates G1 and G2. The second dielectric layer 20 commonly overlaps the pixels (see 110 of FIG. 3). The second dielectric layer 20 may be an inorganic layer and/or an organic layer, and may have a single-layered or multi-layered structure. In some example embodiments, the second dielectric layer 20 may be a single-layered silicon oxide layer.

An upper electrode UE may be located on the second dielectric layer 20. The upper electrode UE may overlap the gate G2 of the second transistor 112. The upper electrode UE may be a portion of a metal pattern. A portion of the gate G2 and its overlying upper electrode UE may define the capacitor (see 113 of FIG. 3).

A third dielectric layer 30 may be located on the second dielectric layer 20 and may cover the upper electrode UE. In some example embodiments, the third dielectric layer 30 may be a single-layered silicon oxide layer. A first connection electrode CNE1 may be located on the third dielectric layer 30. The first connection electrode CNE1 may be coupled to the connection signal line SCL through a contact hole CNT-1 that penetrates the first, second, and third dielectric layers 10, 20, and 30.

A fourth dielectric layer 40 may be located on the third dielectric layer 30. The fourth dielectric layer 40 may be a single-layered silicon oxide layer. A fifth dielectric layer 50 may be located on the fourth dielectric layer 40. The fifth dielectric layer 50 may be an organic layer. A second connection electrode CNE2 may be located on the fifth dielectric layer 50. The second connection electrode CNE2 may be coupled to the first connection electrode CNE1 through a contact hole CNT-2 that penetrates the fourth and fifth dielectric layers 40 and 50.

A sixth dielectric layer 60 may be located on the fifth dielectric layer 50 and may cover the second connection electrode CNE2. The sixth dielectric layer 60 may be an organic layer. A first electrode AE is located on the sixth dielectric layer 60. The first electrode AE may be connected to the second connection electrode CNE2 through a contact hole CNT-3 that penetrates the sixth dielectric layer 60. An opening 70-OP is defined in a pixel definition layer 70. The opening 70-OP of the pixel definition layer 70 exposes at least a portion of the first electrode AE.

The active area (see 100A of FIG. 3) may include an emission area PXA and a non-emission area NPXA adjacent to the emission area PXA. The non-emission area NPXA may adjoin and surround the emission area PXA. In some example embodiments, the first electrode AE has a portion exposed to the opening 70-OP, and the emission area PXA is defined to correspond to the portion of the first electrode AE.

A hole control layer HCL may be arranged in common on the emission area PXA and the non-emission area NPXA. The hole control layer HCL may include a hole transport layer and may further include a hole injection layer. An emission layer EML may be located on the hole control layer HCL. The emission layer EML may be located on a region that corresponds to the opening 70-OP. For example, the emission layer EML may be formed on each of the pixels (see 110 of FIG. 3).

An electron control layer ECL may be located on the emission layer EML. The electron control layer ECL may include an electron transport layer and may further include an electron injection layer. An open mask may be used such that the hole control layer HCL and the electron control layer ECL are formed in common on a plurality of pixels (see 110 of FIG. 3). A second electrode CE may be located on the electron control layer ECL. The second electrode CE has a unitary shape and is located on a plurality of pixels (see 110 of FIG. 3).

A capping layer 80 may be located on the second electrode CE and may be in contact with the second electrode CE. The capping layer 80 may include an organic material. The capping layer 80 may protect the second electrode CE from a subsequent process, such as a sputtering process, and may increase emission efficiency of the light emitting element 114. The capping layer 80 may have a refractive index greater than that of a first inorganic layer 91 which will be discussed.

The encapsulation layer 100-4 may be located on the display element layer 100-3. The encapsulation layer 100-4 may be located on the pixels (see 110 of FIG. 3), and may cover or encapsulate the pixels (see 110 of FIG. 3).

The encapsulation layer 100-4 may include a first inorganic layer 91, an organic layer 92, and a second inorganic layer 93. The first inorganic layer 91 and the second inorganic layer 93 may protect the display element layer 100-3 against moisture and/or oxygen, and the organic layer 92 may protect the display element layer 100-3 against foreign substances such as dust particles. The first inorganic layer 91 and the second inorganic layer 93 may each be one of a silicon nitride layer, a silicon oxynitride layer, and a silicon oxide layer. In some example embodiments of the present invention, the first inorganic layer 91 and the second inorganic layer 93 may include a titanium oxide layer or an aluminum oxide layer. The organic layer 92 may include an acryl-based organic layer, but embodiments according to the present invention are not necessarily limited thereto.

In some example embodiments of the present invention, the capping layer 80 and the first inorganic layer 91 may be provided therebetween with an inorganic layer, for example, a LiF layer. The LiF layer may increase the emission efficiency of the light emitting element 114.

The input sensor 200 may include a base dielectric layer 200-1, a first conductive layer 200-2, a sensing dielectric layer 200-3, a second conductive layer 200-4, and a cover dielectric layer 200-5. After the display panel 100 is formed, the input sensor 200 may be formed in a successive process. Embodiments according to the present invention, however, are not necessarily limited thereto.

The base dielectric layer 200-1 may be directly located on the display panel 100. For example, the base dielectric layer 200-1 may be in direct contact with the second inorganic layer 93. The base dielectric layer 200-1 may have a single-layered or multi-layered structure. Alternatively, the base dielectric layer 200-1 may be omitted.

The first conductive layer 200-2 and the second conductive layer 200-4 may each have a single-layered structure or a multi-layered structure in which a plurality of conductive layers are stacked along the third direction DR3. The single-layered conductive layer may include a metal layer or a transparent conductive layer. The metal layer may include molybdenum, silver, titanium, copper, aluminum, or an alloy thereof. The transparent conductive layer may include transparent conductive oxide, such as indium tin oxide (ITO), indium zinc oxide (IZO), zinc oxide (ZnO), or indium zinc tin oxide (IZTO). Additionally or alternatively, the transparent conductive layer may include a metal nano-wire, a graphene, or a conductive polymer such as PEDOT.

The multi-layered conductive layer may include a plurality of metal layers. The plurality of metal layers may form a tri-layered structure of, for example, titanium/aluminum/titanium. The multi-layered conductive layer may include at least one metal layer and at least one transparent conductive layer.

The first conductive layer 200-2 and the second conductive layer 200-4 may each include patterns that constitute sensing electrodes. For example, the first conductive layer 200-2 may include the first connection pattern 212, and the second conductive layer 200-4 may include the first sensing pattern 211, the second sensing pattern 221, and the second connection pattern 222. In addition, the first conductive layer 200-2 and the second conductive layer 200-4 may each include the sensing lines (see 230 of FIG. 3). For example, the first conductive layer 200-2 may include one or more of the sensing lines 230, and the second conductive layer 200-4 may include other one or more of the sensing lines 230.

The sensing dielectric layer 200-3 may be located between the first conductive layer 200-2 and the second conductive layer 200-4, and may cover the first conductive layer 200-2. A portion of the second conductive layer 200-4 may be electrically connected to a portion of the first conductive layer 200-2 through a contact hole that penetrates the sensing dielectric layer 200-3. The cover dielectric layer 200-5 may be located on the sensing dielectric layer 200-3 and may cover the second conductive layer 200-4.

The sensing dielectric layer 200-3 and the cover dielectric layer 200-5 may each or all include an inorganic layer. The inorganic layer may include at least one selected from aluminum oxide, titanium oxide, silicon oxide, silicon oxynitride, zirconium oxide, and hafnium oxide.

The sensing dielectric layer 200-3 and the cover dielectric layer 200-5 may each or all include an organic layer. The organic layer may include at least one selected from an acryl-based resin, methacryl-based resin, polyisoprene, a vinyl-based resin, an epoxy-based resin, an urethane-based resin, a cellulose-based resin, a siloxane-based resin, a polyimide-based resin, a polyamide-based resin, and a perylene-based resin.

Figure 7:
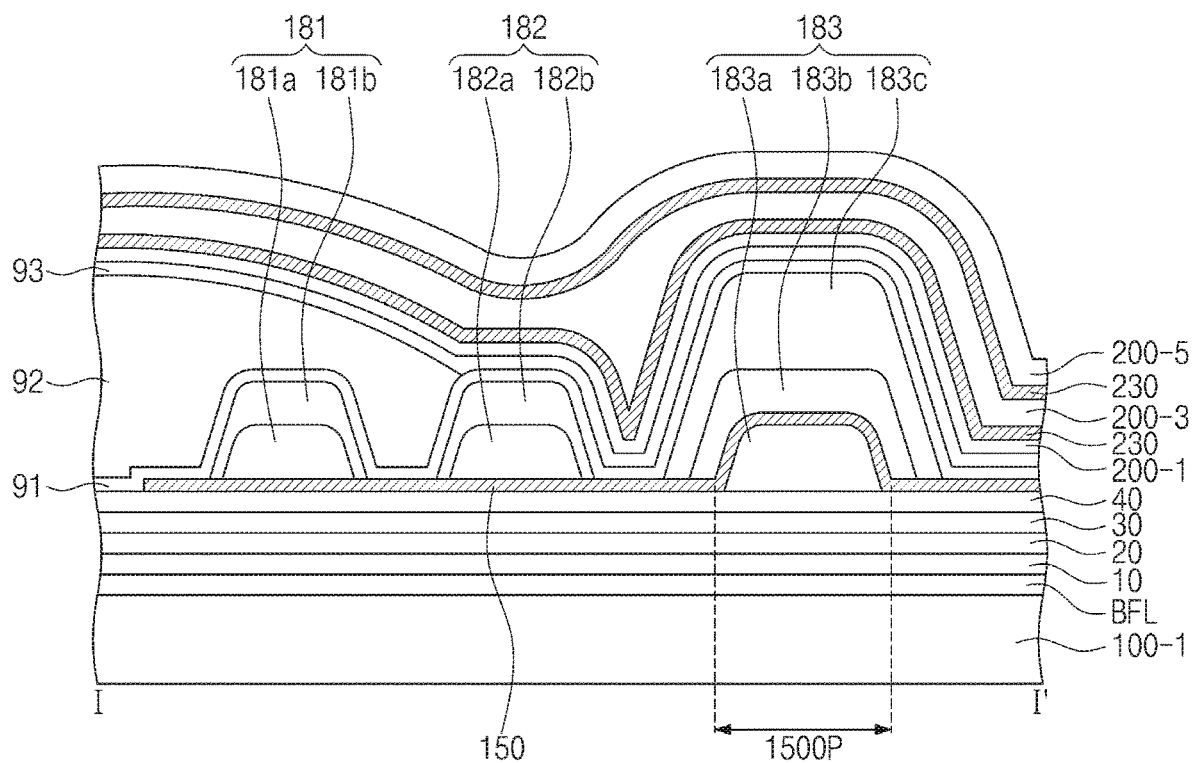
FIG. 7 illustrates a cross-sectional view showing a display device according to some example embodiments of the present invention.
Figure 8:
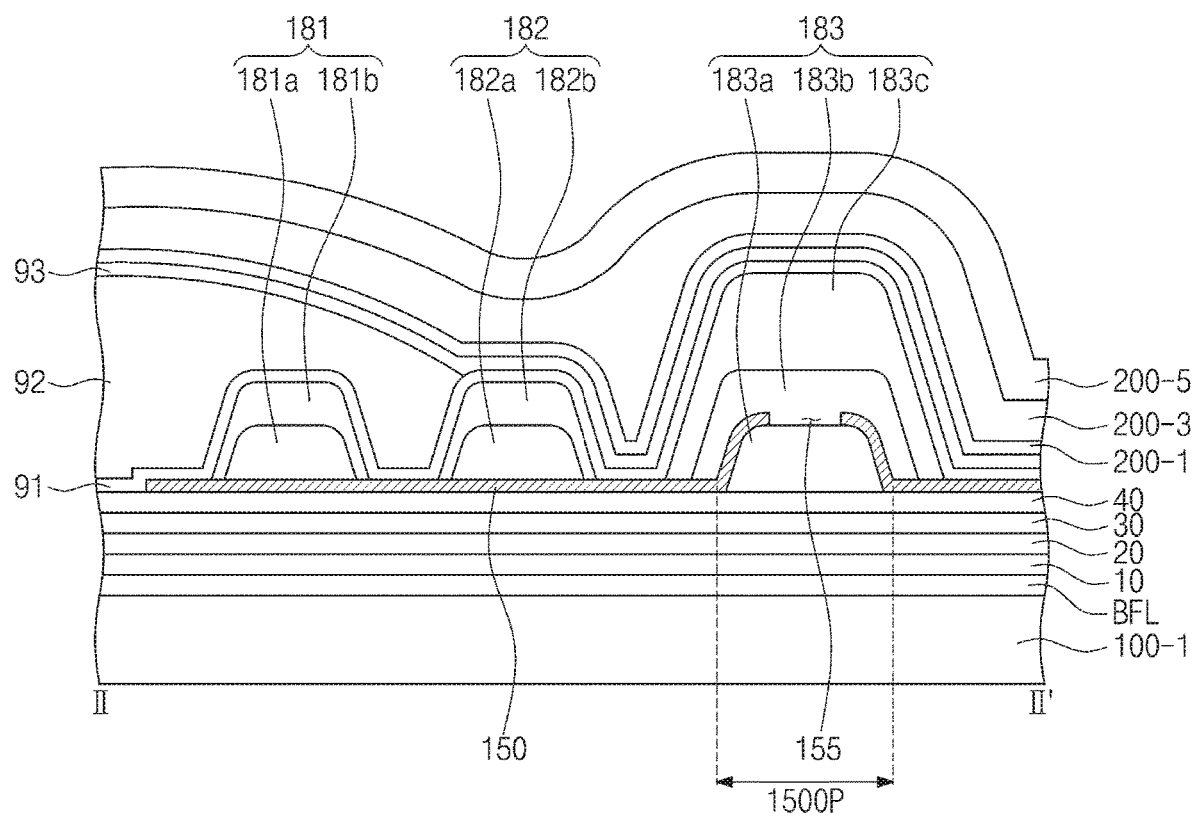
FIG. 8 illustrates a cross-sectional view showing a display device according to some example embodiments of the present invention.

FIG. 7 illustrates a cross-sectional view showing a display device according to some example embodiments of the present invention. FIG. 8 illustrates a cross-sectional view showing a display device according to some example embodiments of the present invention. FIGS. 7 and 8 illustrate cross-sectional views showing a region where the power pattern 150, the first protrusion 181, the second protrusion 182, and the third protrusion 183 are located. FIG. 7 depicts a cross-sectional view taken along line I-I' of FIG. 5A, and FIG. 8 depicts a cross-sectional view taken along line II-II' of FIG. 5A.

Referring to FIGS. 5A, 7, and 8, the first protrusion 181, the second protrusion 182, and the third protrusion 183 may be arranged to be spaced apart from each other. The first, second, and third protrusions 181, 182, and 183 may be called first, second, and third dams, respectively.

When an organic monomer is printed to form the organic layer 92, the first, second, and third protrusions 181, 182, and 183 may serve to prevent or reduce an overflow of the organic monomer.

Each of the first, second, and third protrusions 181, 182, and 183 may have a stack structure. For example, the first protrusion 181 may include a first protruding portion 181a and a second protruding portion 181b stacked on the first protruding portion 181a, the second protrusion 182 may include a first protruding portion 182a and a second protruding portion 182b stacked on the first protruding portion 182a, and the third protrusion 183 may include a first protruding portion 183a, a second protruding portion 183b stacked on the first protruding portion 183a, and a third protruding portion 183c stacked on the second protruding portion 183b.

The first protruding portion 183a may include the same material as that of the fifth dielectric layer (see 50 of FIG.

6), and may be a layer formed in the same process in which the fifth dielectric layer (see 50 of FIG. 6) is formed. Therefore, the first protruding portion 183a may include an organic material. The first protruding portion 181a, the first protruding portion 182a, and the second protruding portion 183b may include the same material as that of the sixth dielectric layer (see 60 of FIG. 6), and may be layers formed in the same process in which the sixth dielectric layer (see 60 of FIG. 6) is formed. The second protruding portion 181b, the second protruding portion 182b, and the third protruding portion 183c may include the same material as that of the pixel definition layer (see 70 of FIG. 6), and may be layers formed in the same process in which the pixel definition layer (see 70 of FIG. 6) is formed.

A portion of the power pattern 150 may be located below the first protrusion 181 and the second protrusion 182, and another portion of the power pattern 150 may be located between the first protruding portion 183a and the second protruding portion 183b. The first protrusion 181 and the second protrusion 182 may each be called an additional protrusion, and the third protrusion 183 may simply be called a protrusion. In addition, the another portion of the power pattern 150 may be called an overlapping portion 1500P. The overlapping portion 1500P may cover a portion of the first protruding portion 183a.

The sensing lines 230 may extend in a direction that intersects an extending direction of each of the first, second, and third protrusions 181, 182, and 183. The sensing lines 230 may be located on the first, second, and third protrusions 181, 182, and 183, and may each have a crooked or curved shape (e.g., following a contour of the curved surface of the layers and elements below the sensing lines 230.

Differently from some example embodiments of the present invention, when the opening 155 is not provided in the power pattern 150, a gas produced by the first protruding portion 183a may be confined between the first protruding portion 183a and the power pattern 150. In this case, the gas may cause a spacing between the first protruding portion 183a and the power pattern 150. The spacing may be attributable to increase in height and deformation in shape of the third protrusion 183, and the deformation of the third protrusion 183 may induce defects such as cuts of the sensing lines 230. According to some example embodiments of the present invention, the opening 155 may be defined on the overlapping portion 1500P. The gas produced from the first protruding portion 183a may be externally discharged through the opening 155. Therefore, deformation in the shape of the third protrusion 183 may be prevented or reduced, and accordingly the sensing lines 230 may be free of defects such as line cut.

Figure 9:
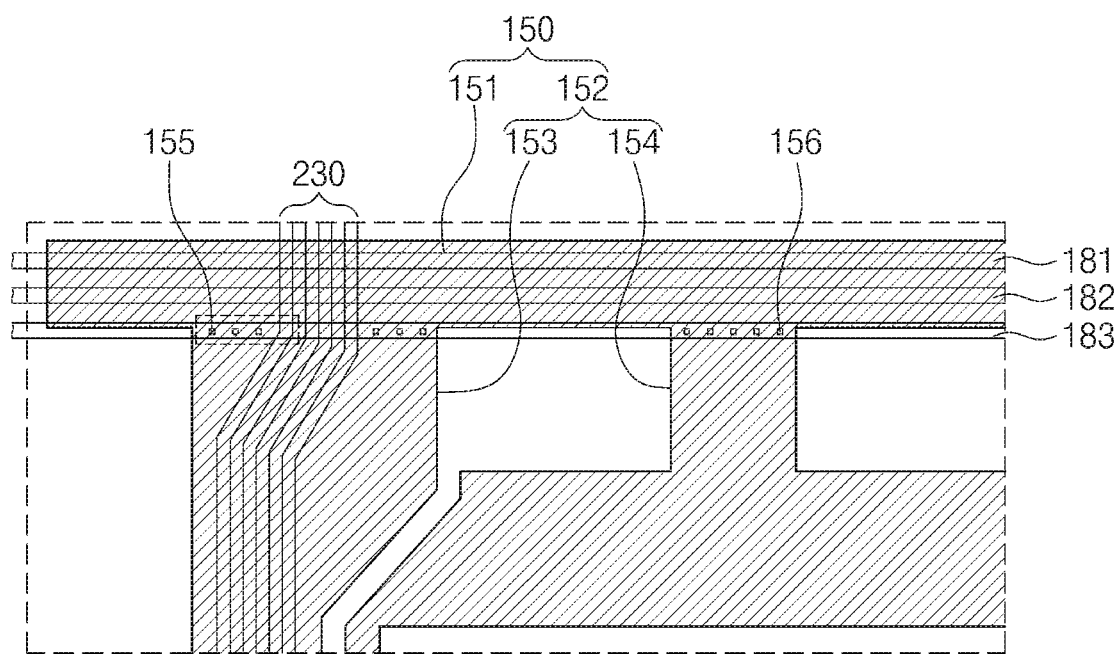
FIG. 9 illustrates an enlarged plan view partially showing a display device according to some example embodiments of the present invention.

FIG. 9 illustrates an enlarged plan view partially showing a display device according to some example embodiments of the present invention.

Referring to FIG. 9, an opening 156 may further be defined in the second branch pattern portion 154 of the power pattern 150. The opening 156 may be provided by removing a portion of the power pattern 150. The opening 156 may expose a component located below the power pattern 150. Therefore, the opening 156 may serve as a pathway through which is discharged a gas produced by the component located below the power pattern 150. Accordingly, it may be possible to prevent or reduce issues caused by the gas.

According to the discussed above, an overlapping portion of a power pattern may be located between first and second protruding portions of a protrusion, and an opening may be defined in the overlapping portion of the power pattern. A gas produced from the first protruding portion may be externally discharged through the opening defined in the power pattern. Accordingly, it may be possible to inhibit delamination of the second protruding portion and thus to prevent or reduce cuts of sensing lines on the second protruding portion.

Moreover, the sensing lines may overlap the power pattern, and may not overlap the opening. As the power pattern is supplied with constant voltage, the power pattern may shield noise signals that affect the sensing lines. Therefore, it may be possible to prevent or reduce sensitivity failure due to noise signals.

Although the embodiments have been described with reference to a number of illustrative examples thereof, it will be understood by those of ordinary skill in the art that various changes in form and details may be made without departing from the spirit and scope of the present invention as set forth in the following claims. Thus, the technical scope of the present invention is not limited by the embodiments and examples described above, but by the following claims and their equivalents.

What is claimed is:

1. A display device, comprising:
a base layer having a first area, a second area adjacent to the first area, and comprising a bending area;
a plurality of pixels on the first area of the base layer;
a power line configured to supply the plurality of pixels with power;
a power pattern on the second area and electrically connected to the power line and overlapping the bending area;
a protrusion on the second area, the protrusion surrounding at least a portion of the first area and including a first protruding portion and a second protruding portion on the first protruding portion;
an encapsulation layer on the plurality of pixels;
a plurality of sensing electrodes on the first area and directly on the encapsulation layer; and
a plurality of sensing lines on the second area and electrically connected to the plurality of sensing electrodes,
wherein portions of the plurality of sensing lines located on the bending area all overlap with the power pattern.

2. The display device of claim 1, wherein the power pattern includes an overlapping portion between the first protruding portion and the second protruding portion, and
wherein the plurality of sensing lines is located on the second protruding portion.

3. The display device of claim 2, wherein the overlapping portion has openings,
wherein a portion of the protrusion extends along a first direction,
wherein the openings are arranged along the first direction, and
wherein the bending area extends along the first direction and is spaced apart from the first area in a second direction intersecting the first direction.

4. The display device of claim 3, wherein the plurality of sensing lines is spaced apart from the openings in a plan view.

5. The display device of claim 3, wherein the power pattern includes: a first pattern portion that extends along the first direction; and a plurality of second pattern portions that protrude along the second direction from the first pattern portion, and
wherein the plurality of second pattern portions includes:
a first branch pattern portion that overlaps at least portions of the plurality of sensing lines; and a second branch pattern portion that does not overlap the plurality of sensing lines.

6. The display device of claim 5, wherein the openings are defined in each of the first branch pattern portion and the second branch pattern portion.

7. The display device of claim 5, wherein the openings are defined in the first branch pattern portion and is not defined in the second branch pattern portion.

8. The display device of claim 5, wherein the overlapping portion includes a portion of each of the plurality of second pattern portions.

9. The display device of claim 5, wherein each of the plurality of second pattern portions has a width of equal to or less than 1,300 micrometers (μm) in the first direction.

10. The display device of claim 3, wherein a minimum distance between the openings and the plurality of sensing lines is equal to or greater than 58.4 μm in a plan view.

11. The display device of claim 3, wherein each of the plurality of sensing lines extends in the second direction.

12. The display device of claim 1, wherein each of the plurality of sensing lines that overlap the protrusion has a crooked shape.

13. The display device of claim 1, further comprising an additional protrusion on the second area and is closer than the protrusion to the first area,
wherein a portion of the power pattern is below the additional protrusion, and
wherein the additional protrusion and the second protruding portion include a same material.

14. A display device, comprising:
a base layer having a first area, a second area adjacent to the first area, and comprising a bending area;
a plurality of pixels on the first area of the base layer;
a power line configured to supply the plurality of pixels with power;
a power pattern on the second area and electrically connected to the power line and overlapping the bending area;
a protrusion on the second area, the protrusion surrounding at least a portion of the first area and including a first protruding portion, a second protruding portion on the first protruding portion, and a third protruding portion on the second protruding portion;
an encapsulation layer on the plurality of pixels;
a plurality of sensing electrodes on the first area and directly on the encapsulation layer; and
a plurality of sensing lines on the second area and electrically connected to the plurality of sensing electrodes,
wherein the plurality of sensing lines is located on the third protruding portion, and
wherein portions of the plurality of sensing lines located on the bending area all overlap with the power pattern.

15. The display device of claim 14, wherein a portion of the protrusion extends along a first direction, and
wherein portions of the plurality of sensing lines that overlap the portion of the protrusion extend along a second direction intersecting the first direction.

16. The display device of claim 15, wherein the power pattern includes an overlapping portion between the first protruding portion and the second protruding portion, the overlapping portion having an opening, and
wherein the plurality of sensing lines is spaced apart from the opening in the first direction.

17. The display device of claim 16, wherein
the power pattern includes a first branch pattern portion and a second branch pattern portion that extend along the second direction and that are between the first protruding portion and the second protruding portion, and
the opening is provided in at least one selected from among the first branch pattern portion and the second branch pattern portion.

18. The display device of claim 17, wherein
at least portions of the plurality of sensing lines are on the first branch pattern portion, and
the opening is defined in the first branch pattern portion.

19. The display device of claim 14, wherein each of the first protruding portion, the second protruding portion, and a third protruding portion includes an organic material.

* * * * *